United States Patent [19]

Pease et al.

[11] 3,801,837

[45] Apr. 2, 1974

[54] PHOTOCOUPLING LINE ISOLATION

[75] Inventors: Logan L. Pease, Bountiful; Robert W. Huggins, Jr., North Salt Lake, both of Utah

[73] Assignee: Eaton Corporation, Cleveland, Ohio

[22] Filed: Dec. 7, 1972

[21] Appl. No.: 313,040

Related U.S. Application Data

[63] Continuation-in-part of Ser. No. 161,470, July 12, 1971, abandoned.

[52] U.S. Cl. ............ 307/311, 317/235 N, 307/290, 307/312, 250/211 J, 250/209, 250/217 SS

[51] Int. Cl. ........................................ H01l 15/00

[58] Field of Search ........ 317/235 N; 307/311, 290, 307/312; 250/211 J, 209, 217 SS

[56] References Cited

UNITED STATES PATENTS 3,708,672 2/1973 Marinkovic ........................ 250/209

*Primary Examiner*—Martin H. Edlow
*Attorney, Agent, or Firm*—Teagno & Toddy

[57] ABSTRACT

A signal isolation and noise suppression circuit wherein electrooptical signals from a light-emitting diode of a signal source circuit are coupled to a phototransistor of a signal receiving circuit while physically isolating the signal receiving circuit from the source. The development also comprises a noise suppressing circuit.

5 Claims, 1 Drawing Figure

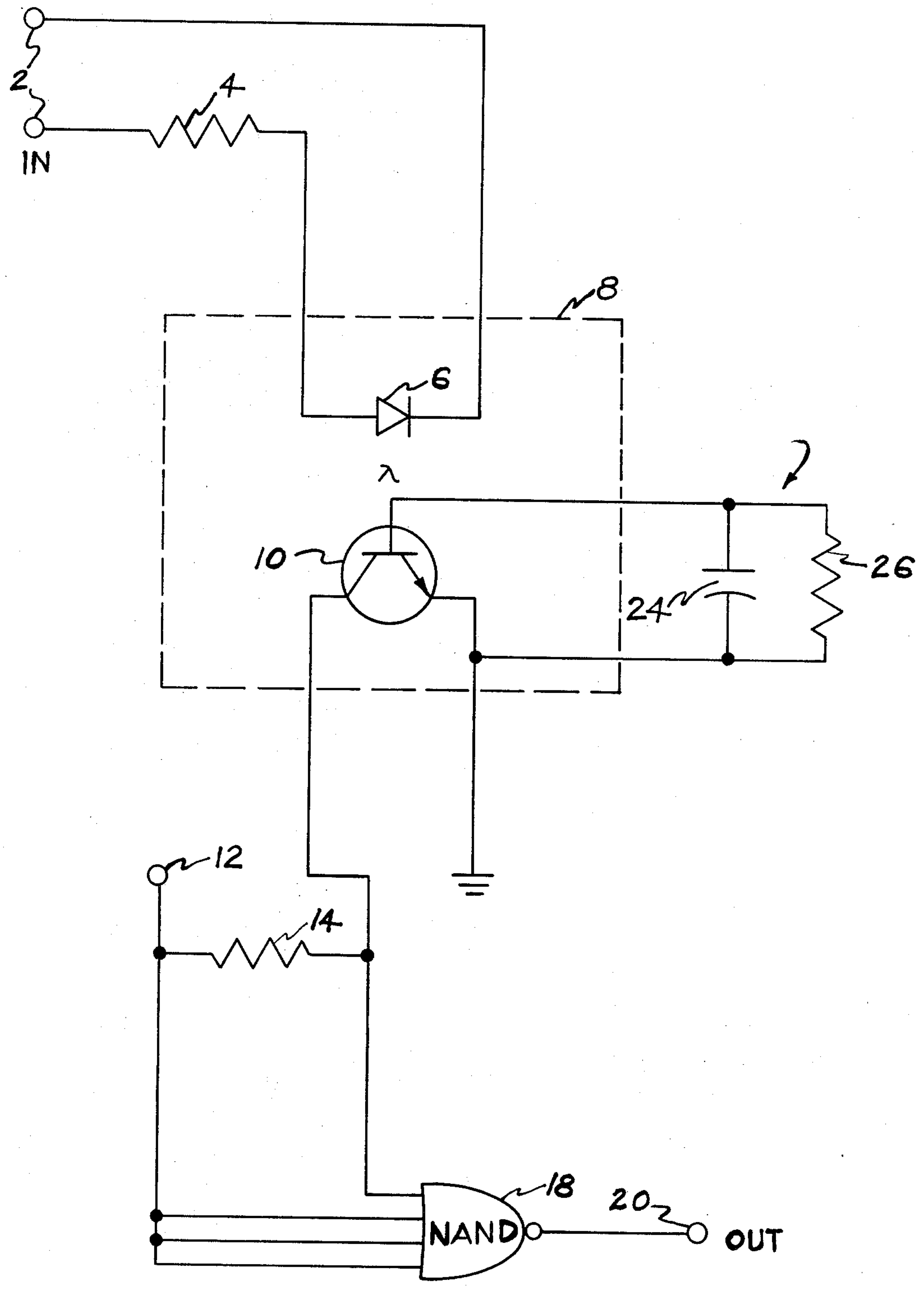
2
IN
4
8
6
λ
10
24
26
12
14
18
NAND
20
OUT

PHOTOCOUPLING LINE ISOLATION

CONTINUITY

This application is a continuation-in-part of our copending U.S. Pat. application Ser. No. 161,470, filed July 12, 1971, now abandoned.

BACKGROUND

1. Field of Invention

This invention relates to signal isolation and noise suppression techniques and is particularly directed to methods and apparatus employing electrooptical elements to couple electronic signal circuits while, for practical purposes, preventing passage of undesired signals, such as noise.

2. Prior Art

In electronic signal circuitry, it is always desirable to be able to pass desired signals, while minimizing or eliminating undesired signals, such as noise. Moreover, with the development of computers and logic circuits, which are quite delicate, but which are frequently employed to control more rugged circuits and apparatus, it is important to isolate the computer and logic circuits against spurious signals which might damage components or result in improper information transfer. Numerous techniques have been proposed, heretofore, for accomplishing such isolation and to suppress noise. However, none of the prior art techniques have been entirely satisfactory. Many of the prior art isolation techniques have been incompatible with computer and logic circuitry. Other prior art techniques have employed complex and expensive equipment. Many prior art isolation techniques have failed to satisfactorily reduce spurious signals and, hence, are relatively ineffective.

BRIEF SUMMARY AND OBJECTS OF THE INVENTION

These disadvantages of the prior art are overcome with the present invention and signal isolation and noise suppression are provided which, within the limits of use, essentially precludes passage of undesired signals and which is compatible with computer and logic circuits, yet is simple and inexpensive.

The advantages of the present invention are preferably attained by providing a photoelectric coupling circuit comprising a light-emitting diode and a phototransistor, which serve to optically pass desired signals, yet employ no physical connection between the coupled circuits and, hence, essentially preclude passage of undesired signals. Moreover, signals passed by the photocoupling component serve to actuate a Schmitt trigger circuit which assures that only signals of a predetermined magnitude will be passed to the computer or logic circuitry.

Accordingly, it is an object of the present invention to provide improved methods and apparatus for isolating electronic signals circuits.

Another object of the present invention is to provide methods and apparatus for isolating electronic signal circuits which are compatible with computer and logic circuitry.

A further object of the present invention is to provide methods and apparatus for isolating electronic signal circuits which provide no physical connection between the coupled circuits.

An additional object is to provide a novel noise suppressing circuit and related method.

A specific object of the present invention is to provide methods and apparatus for noise suppression and for isolating electronic signal circuits comprising structure for electrooptically coupling the circuits to pass desired signals, and employing the output of the electrooptic coupler to actuate a Schmitt trigger circuit to assure that, within the range of use, only signals of predetermined magnitude are passed to the protected circuitry.

These and other objects and features of the present invention will be apparent from the following detailed description, taken with reference to the accompanying drawing.

BRIEF SUMMARY OF THE DRAWING

The FIGURE is a diagrammatic representation of electronic signal isolation and noise suppression circuitry embodying the present invention.

DETAILED DESCRIPTION OF THE ILLUSTRATED EMBODIMENT

In that form of the present invention chosen for purposes of illustration, an external signal source, not shown, at, for example, +24 volts, is connected across input terminals 2 and is passed through a current limiting resistor 4 to a light-emitting diode 6, of a photocoupling unit, indicated generally at 8. The photocoupling unit 8 also includes a phototransistor 10 which has the emitter-collector circuit thereof connected between ground and a suitable voltage source, for example, a +5 volt source, indicated at 12, through resistor 14. The base electrode of phototransistor 10 is photoresponsive and serves to bias the phototransistor 10 to conduction when the photon density, emitted by the light-emitting diode 6, reaches a predetermined magnitude. The photon density, emitted by light-emitting diode 6, is determined by the magnitude of the current flowing through the diode 6. Resistor 4 limits the input current to values which will not be harmful to diode 6.

A photocoupling noise suppression circuit, generally designated 22, bridges between the base and the emitter of phototransistor 10 and induces a time delay in phototransistor 10 reaching conduction. The emitter of phototransistor 10 is at ground and the noise suppression circuit 22 comprises a capacitor 24 connected in parallel with a resistor 26 having a relatively large ohm value.

When current passes through the light-emitting diode 6, the emitted photons impinge on the base of the phototransistor 10 and, instead of immediately triggering the flow of current through the phototransistor 10, cause a charge to be built up in capacitor 24 until the triggering level of phototransistor 10 is reached. At this time, the capacitor 24 discharges and phototransistor 10 becomes conductive. The value of capacitor 24 is chosen based on the amount of delay desired. Not only does the noise suppression circuit 22 prevent a false ignition of transistor 10 due to noise such as high speed induced electrical noise in the output circuit, but also eliminates phototransistor discharge caused by contact bounce of a switch normally comprising part of the input circuitry.

The output of phototransistor 10 is applied to one input of a NAND Schmitt trigger gate 18, while all of the other inputs to Schmitt trigger gate 18 are connected to voltage source 12. Moreover, Schmitt trigger gate 18 cooperates with resistor 14 to form a Schmitt trigger circuit. Thus, the output of Schmitt trigger gate 18, at terminal 20, will be a signal of unit magnitude, when there is no output from phototransistor 10; and will have zero magnitude, when a signal is present from phototransistor 10. Schmitt trigger gates are commercially available; for example, see "Integrated Circuits Catalog for Design Engineers," 1st Ed. of Texas Instruments, Inc. at pp. 6–22 and cross-reference "TTL Integrated Circuits Data Book," Motorola, May, 1971, p. 1–1.

In use, it is often necessary or desirable to connect external signal sources to supply signals to computer or logic circuits. Thus, in a system for automatically controlling stacker cranes or the like, it is desirable to provide sources, carried by the crane, to supply signals to the system control logic indicating the status or position of the crane. Unfortunately, such systems are frequently required to operate in areas which are subject to strong electrical transients and noise, resulting from the operation of nearby equipment. To overcome or essentially nullify these problems, the desired sources are connected to apply signals through input terminal 2 of the circuit of the present invention to actuate the light-emitting diode 6. Resistor 4 limits the magnitude of the in-coming signals to a value which will not damage diode 6. When light-emitting diode 6 is energized by a desired signal, it emits photons which become incident on the photoresponsive base of phototransistor 10 and this serves to bias the phototransistor 10 into conduction once the capacitor 24 has charged. It should be noted that there is no physical connection between the input circuitry comprising light-emitting diode 6 and the output circuitry comprising phototransistor 10 and signal coupling is accomplished solely by the optical path between these components. Thus, complete isolation and noise suppression are accomplished. The signals passed through the photocoupler unit 8 are applied to Schmitt trigger gate 18. Schmitt trigger gate 18 normally has an output of unit magnitude and, upon receipt of the signal from the photocoupler unit 8, the output of Schmitt trigger gate 18 falls to zero. The output of Schmitt trigger gate 18 is applied through terminal 20 to the system control logic circuits and provides a binary zero or one, depending upon whether or not a desired input signal is present.

Obviously, numerous variations and modifications may be made without departing from the present invention. Accordingly, it should be clearly understood that the form of the present invention described above and shown in the accompanying drawing is illustrative only and is not intended to limit the scope of the invention.

We claim:

1. A signal isolation system comprising:
a source of electronic signals;
an input circuit, receiving said electronic signals, comprising a light-emitting diode serving to optically transmit signals received from said source;
an output circuit electrically isolated from the input circuit comprising a phototransistor receiving said optical signals and creating electronic signals therefrom and a Schmitt trigger circuit connected to the collector of said phototransistor.

2. The system of claim 1 wherein said Schmitt trigger circuit comprises a NAND gate having one input connected to receive electronic signals from said phototransistor and the remainder of its inputs connected in common to a voltage source and a resistor connected between said one input and said voltage source.

3. The system of claim 1 further comprising resistance means connected in series between said source and said light-emitting diode to limit the magnitude of signals passed to said light-emitting diode.

4. The system of claim 1 further comprising noise suppression circuitry comprising capacitor means bridging between the base and emitter of the phototransistor.

5. A signal isolation system comprising:
a source of input electronic signals;
an input circuit comprising a light-emitting diode receiving said input electronic signals from said source and transmitting corresponding optical signals;
an output circuit electrically isolated from the input circuit comprising a phototransistor the base of which is in optical communication with said light-emitting diode to receive said optical signals, switch means connected to the collector of said phototransistor and being switched by said phototransistor including a logic gate having a conductive state which is changed when the phototransistor is conductive, and noise suppression circuitry comprising capacitor means bridging between the base and the emitter of the phototransistor.

* * * * *